(12) United States Patent
Shang et al.

(10) Patent No.: US 11,423,999 B2
(45) Date of Patent: Aug. 23, 2022

(54) MEMORY AND ITS ADDRESSING METHOD INCLUDING REDUNDANT DECODING AND NORMAL DECODING

(71) Applicant: ChangXin Memory Technologies, Inc., Hefei (CN)

(72) Inventors: WeiBing Shang, Hefei (CN); Liang Zhang, Hefei (CN); Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/257,532

(22) PCT Filed: Nov. 27, 2019

(86) PCT No.: PCT/CN2019/121162
§ 371 (c)(1),
(2) Date: Dec. 31, 2020

(87) PCT Pub. No.: WO2021/056804
PCT Pub. Date: Apr. 1, 2021

(65) Prior Publication Data
US 2022/0028471 A1    Jan. 27, 2022

(30) Foreign Application Priority Data

Sep. 24, 2019  (CN) .......................... 201910904486.4

(51) Int. Cl.
*G11C 29/10* (2006.01)
*G11C 7/10* (2006.01)
(Continued)

(52) U.S. Cl.
CPC ............ *G11C 29/10* (2013.01); *G11C 7/1012* (2013.01); *G11C 7/1039* (2013.01); *G11C 29/18* (2013.01);
(Continued)

(58) Field of Classification Search
None
See application file for complete search history.

(56) References Cited

U.S. PATENT DOCUMENTS

| 5,434,814 A | 7/1995 | Cho et al. |
| 5,519,657 A * | 5/1996 | Arimoto ................ G11C 29/50 365/200 |

(Continued)

FOREIGN PATENT DOCUMENTS

| CN | 105513646 A | 4/2016 |
| CN | 109841260 A | 6/2019 |

(Continued)

OTHER PUBLICATIONS

PCT/CN2019/121162 International Search Report dated Jun. 23, 2020.

*Primary Examiner* — J. H. Hur
(74) *Attorney, Agent, or Firm* — Alston & Bird LLP

(57) ABSTRACT

A memory device and its addressing method are disclosed. The memory device includes: an input module for receiving an input signal including an access address, a command, and a decoding selection instruction; a memory array including memory blocks, each having memory units arranged in an array; and a control module including memory block local control units, which respectively connected to one of the memory blocks in one-to-one correspondence. The memory block local control unit includes: at least one decoding unit, which performs redundant decoding or normal decoding to the input signal. The input of the decoding unit is coupled to the input module and the output is coupled to one of the memory units. The device further includes a selection module; the input of the selection module is coupled to the input module, and the output is coupled to the decoding unit. The addressing efficiency of the memory device is improved.

13 Claims, 5 Drawing Sheets

(51) Int. Cl.
*G11C 29/18* (2006.01)
*G11C 29/36* (2006.01)
(52) U.S. Cl.
CPC ...... *G11C 29/36* (2013.01); *G11C 2029/1802* (2013.01)

(56) References Cited

U.S. PATENT DOCUMENTS

| | | | | | |
|---|---|---|---|---|---|
| 5,544,106 | A | * | 8/1996 | Koike | G11C 29/80 365/200 |
| 5,808,948 | A | * | 9/1998 | Kim | G11C 29/24 365/201 |
| 5,953,267 | A | * | 9/1999 | Oh | G11C 29/844 365/189.04 |
| 6,208,570 | B1 | * | 3/2001 | Brown | G11C 29/24 365/200 |
| 6,252,809 | B1 | * | 6/2001 | Kim | G11C 29/785 365/200 |
| 6,304,498 | B1 | | 10/2001 | Ikeda | |
| 6,405,324 | B2 | * | 6/2002 | Shore | G11C 7/1006 714/11 |
| 2003/0065465 | A1 | * | 4/2003 | Johnson | G11C 7/1093 702/89 |
| 2005/0207243 | A1 | * | 9/2005 | Kuroki | G11C 29/787 365/200 |

FOREIGN PATENT DOCUMENTS

| | | |
|---|---|---|
| CN | 210606641 U | 5/2020 |
| WO | WO 2021/056804 A1 | 4/2021 |

* cited by examiner

MEMORY AND ITS ADDRESSING METHOD INCLUDING REDUNDANT DECODING AND NORMAL DECODING

CROSS REFERENCES TO RELATED APPLICATIONS

This application is a national phase entry of International Application No. PCT/CN2019/121162 filed on Nov. 27, 2019, which claims the benefit of priority to Chinese Patent Application CN201910904486.4 filed at CNIPA on Sep. 24, 2019, both entitled "Memory and Its Addressing Method," the contents of both which as are incorporated herein by reference in their entireties.

TECHNICAL FIELD

The present invention relates to the technical field of memory, in particular to a memory and an addressing method thereof.

BACKGROUND

In the design of DRAM memory, redundant cells are generally added internally to repair defective row storage locations and column storage locations at normal storage locations that occur during the manufacturing process.

FIG. 1 is a schematic diagram of the layout positions of normal and redundant storage units in a current DRAM memory.

In FIG. 1 word lines (WL) and bit lines (BL) are shown only. Among them, 16 rows of redundant storage units are set for every 1,024 horizontal word lines (WLs), corresponding to 16 redundant word lines (RedWLs), and 16 columns of redundant storage units are set for every 512 vertical bit lines BLs, corresponding to 16 redundant bit lines (Red-BLs).

In the memory chip testing phase, normal storage units need to be accessed to test if each normal storage unit is valid. If it is invalid, the address of the invalid storage unit needs to be recorded and redundant storage units will replace the invalid storage units for data storage.

Therefore, in the chip test phase, it is necessary to test the normal storage units and the redundant storage units, respectively. Because the addresses of the normal storage unit and the redundant storage unit use different decoding methods in the current technique, the normal storage units and the redundant storage units are usually tested separately to access the corresponding address through different test paths and timing controls. During the test, it is necessary to switch frequently between the two tests. This switch increases the testing time. In addition, the difference in the test path and the timing controls also easily introduces human error, resulting in a decrease in test accuracy.

Therefore, it is necessary to improve the memory addressing test efficiency in the current techniques.

BRIEF SUMMARY

The disclosure provides a memory device and an addressing method thereof to improve the test efficiency of the memory device. The memory device includes an input module for receiving an input signal, wherein the input signal includes an access address, a command, and a decoding selection instruction, wherein the access address includes a block address, a row address, and a column address; a memory array comprising a plurality of memory blocks, wherein each of the plurality of memory blocks includes a plurality of memory units arranged in an array; a control module connecting to an output of the input module, wherein the control module comprises a plurality of memory block local control units, wherein each of the plurality of memory block local control units is connected to one of the plurality of memory blocks in one-to-one correspondence, wherein the plurality of memory block local control units each includes one decoding unit, wherein the decoding unit is configured to perform redundant decoding or normal decoding on the input signal, wherein an input of the decoding unit is coupled to the input module, an output of the decoding unit is coupled to one of the plurality of memory blocks; and wherein the control module decodes the input signal having a corresponding block address and select a memory unit of the plurality of memory units of a corresponding access address; and a selection module, wherein an input of the selection module is coupled to the input module, and an output of the selection module is coupled to the decoding unit, wherein the selection module is configured to send the decoding selection instruction in the input signal to the decoding unit to generate a first enable signal to perform redundant decoding or normal decoding.

In some examples, the decoding unit comprises: a redundant pre-decoding unit, a normal pre-decoding unit, and a secondary decoding unit; wherein the output of the selection module is coupled to an enable input of the redundant pre-decoding unit and an enable input of the normal pre-decoding unit; and wherein an output of the redundant pre-decoding unit and an output of the normal pre-decoding unit are both coupled to an input of the secondary decoding unit.

In some examples, each of the plurality of the memory block local control units further comprises: an address comparison unit, wherein an input of the address comparison unit is coupled to the input module, and an output of the address comparison unit is coupled to the decoding unit, wherein the address comparison unit stores defective address information, compares the access address in the input signal with the defective address information, and outputs a second enable signal based on comparison, and wherein the second enable signal controls the decoding unit to perform redundant decoding or normal decoding on the input signal.

In some examples, the input module comprises: an input terminal, a buffer unit coupled to the input terminal, a logic control unit coupled to an output of the buffer unit, and a normal address latch unit coupled to an output of the logic control unit.

In some examples, each of the plurality of memory block local control units further comprises: a first local latch unit, wherein an input of the first local latch unit is coupled to an output of the normal address latch unit of the input module.

In some examples, the input module comprises: a plurality of input pins, wherein the input signal comprises multiple sets of digital signals, wherein each set of the multiple sets of digital signals comprises a plurality of level signals from a plurality of input pins, wherein the decoding selection instruction includes one of the plurality of level signals from one of the plurality of input pins of one of the multiple sets of digital signals, and agrees with how the input signal is decoded.

In some examples, the selection module comprises: a multiplexer comprising a first input of the multiplexer coupled to the input module, a second input coupled to a reference level, and a control terminal coupled to a test control signal, wherein the test control signal controls the multiplexer to output a signal corresponding to the first input or the second input of the multiplexer.

In some examples, the selection module further comprises: a test enable latch unit; an input of the test enable latch unit is coupled to an output of the multiplexer.

In some examples, the decoding unit further comprises: a second local latch unit, wherein an input of the second local latch unit is coupled to an output of the test enable latch unit of the selection module.

In some examples, each of the plurality of memory block local control units comprises: two decoding units, wherein the two decoding units decode the row address and the column address, respectively, in the access address.

The present invention also provides a memory addressing method, comprising: receiving an input signal comprising: an access address, a command, and a decoding selection instruction, where the access address includes a block address, a row address, and a column address; performing redundant decoding or normal decoding on the input signal according to the decoding selection instruction in the input signal; and selecting a memory unit corresponding to the access address obtained after decoding.

In some examples, the redundant decoding comprises redundant pre-decoding and secondary decoding; and wherein the normal decoding includes normal pre-decoding and secondary decoding.

In some examples, the method comprises: comparing the access address in the input signal with a defect address information in normal use of the memory device and performing redundant decoding or normal decoding on the input signal according to a comparison result.

In some examples, the input signal is received through a plurality of input pins, wherein the input signal comprises: multiple sets of digital signals, wherein each of the multiple sets of digital signals includes a plurality of level signals inputted through the plurality of input pins, and wherein the decoding selection instruction is one of the plurality of level signals inputted from one of the plurality of input pins of said set of digital signals, and wherein the decoding selection instruction agrees with how the input signal is decoded.

In some examples, the memory device addressing method further comprises: decoding the row address and the column address separately in the input signal.

The memory device of the present invention can control input signals to the address/command to perform the corresponding redundant decoding or normal decoding, by setting the decoding selection instruction, thereby making the test process more flexible without having to switch the signal input interface. The path and timing of the address signal input are consistent with the generating path and timing of the first enable signal. As a result, human test errors can be reduced, thereby improving the test accuracy and convenience.

DETAILED DESCRIPTION OF THE PREFERRED EMBODIMENTS

The specific implementation of a memory device and its addressing method according to the embodiments of the present disclosure will be described in detail with reference to the accompanying drawings in the following paragraphs.

Figure 1:
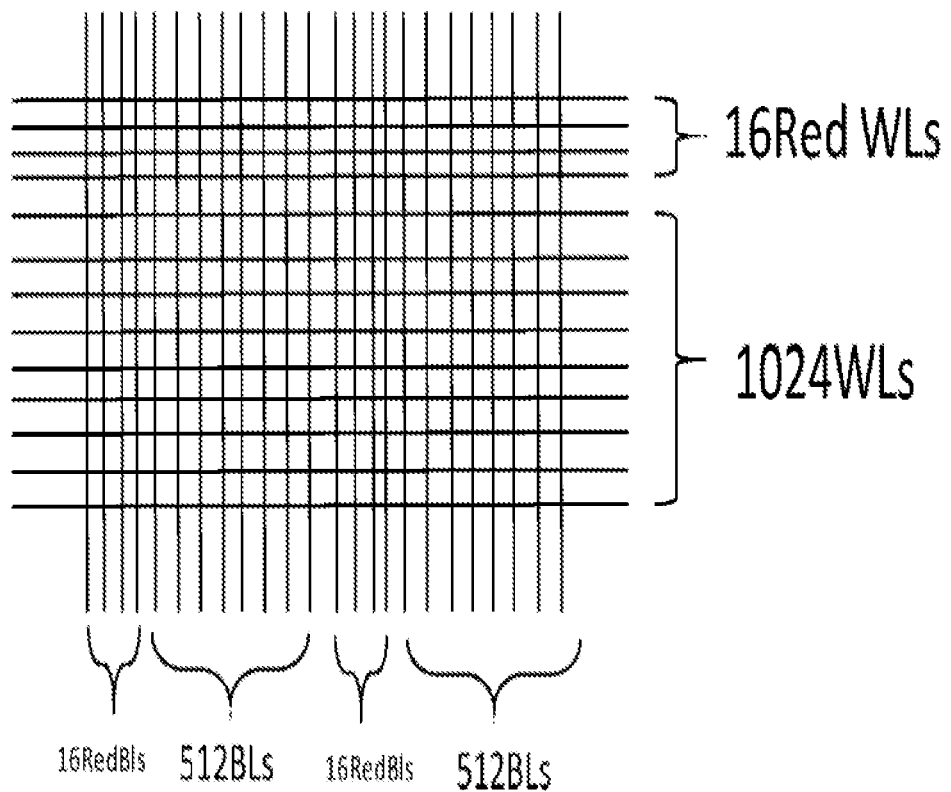
FIG. 1 is a schematic structural diagram of a current memory array.
Figure 2:
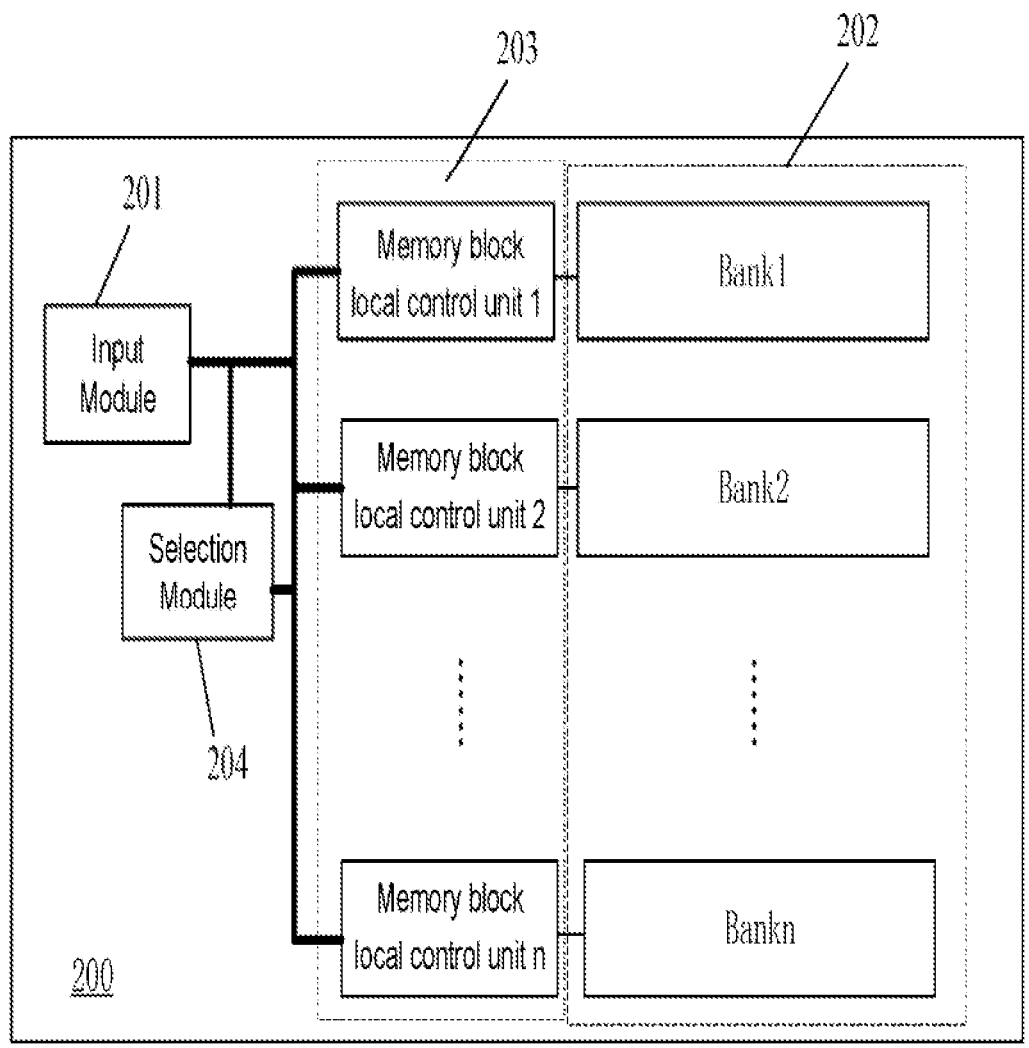
FIG. 2 is a schematic structural diagram of a memory device according to some embodiments of the present disclosure.

FIG. 2 is a schematic structural diagram of a memory device according to some embodiments of the present disclosure.

The memory device 200 includes: an input module 201, a storage array 202, a control module 203, and a selection module 204.

The memory array 202 may include multiple memory blocks (Banks), such as Bank1, Bank2, . . . to Bankn. Each Bank may include multiple memory cells distributed in arrays, and each memory cell has a row address and a column address. Therefore, each memory cell in the memory array 202 has a block (Bank) address, a row address, and a column address. When addressing the memory unit, first find the memory block where the memory unit is located according to the block address, and then find the specific location of the memory unit in the memory block according to the row address and column address. Each memory block includes normal memory units arranged in arrays and redundant memory units arranged in arrays. The address decoding of the normal memory units and the address decoding of the redundant memory units require different decoding methods respectively.

The input module 201 is configured to receive input signals of access address and commands, and input signals of address and commands of decoding selection instruction. The access address includes a block address, a row address, and a column address. The decoding selection instruction corresponds to the address decoding mode and is used to instruct redundant decoding or normal decoding of the address.

The control module 203 includes a plurality of memory block local control units, for example, memory block local control unit 1~memory block local control unit n, respectively, connected to the corresponding memory block Bank1~memory block Bankn; these memory block local control units are used to decode address/command input signals with corresponding block addresses to select the memory unit consistent with the access address.

The input module 201 is connected to the control module 203. After the address/command input signal received by the input module 201 is processed, the input signal enters the memory block local control unit with the corresponding block address in the control module 203 for decoding. The memory block local control unit includes: at least one decoding unit, configured to perform redundant decoding or normal decoding on the address/command input signal, the input end of the decoding unit is coupled to the input module, and the output terminal of the decoding unit is coupled to the memory block. Generally, each memory block local control unit includes two decoding units, a row decoding unit for row address decoding, and a column decoding unit for column address decoding.

The input terminal of the selection module 204 is coupled to the input module 201, and the output terminal of the selection module 204 is coupled to the decoding unit in the memory block local control unit and is configured to input signals according to the address/command. The decoding selection instruction outputs the first enable signal to the decoding unit in the local control unit of the corresponding memory block to control the decoding unit to perform redundant decoding or normal decoding on the address/command input signal.

Figure 3:
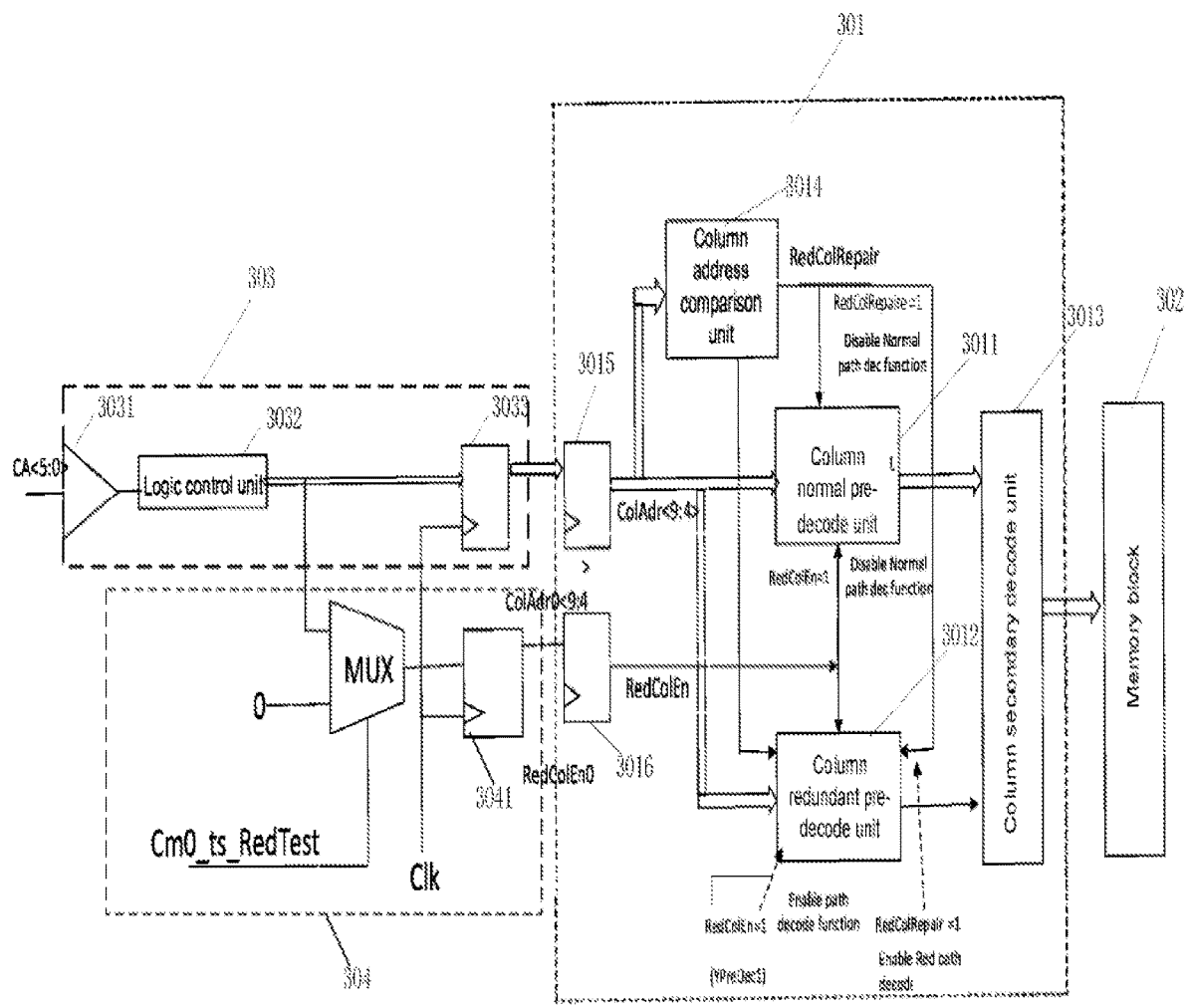
FIG. 3 is a schematic structural diagram of a memory device according to some embodiments of the present disclosure.

FIG. 3 is a schematic structural diagram of the memory device according to some embodiment of the present invention.

In FIG. 3, only the exemplary column decoding part of the circuit structure is shown.

The input module 303 includes: an input terminal coupled to the input of a buffer unit 3031, and an output coupled to a logic control unit 3032 for its output to reach the normal address latch unit 3033.

In this specific implementation, taking LPDDR4 as an example, the input terminal includes 6 pins (only one shown), which are pins CA0~CA5, used respectively to input high and low electric signals to form a set of digital signals as the address/command input signal CA<5:0>. A complete address/command input signal can enter through one input or multiple inputs. The address/command input signal includes block address, column address, row address, and command information. The command can be row address decoding or column address decoding, read and write operation instructions, or refresh. The address/command input signal CA<5:0> also includes a decoding selection instruction, wherein the decoding selection instruction is used to select redundant decoding or normal decoding to the address/command input signal.

It is usually necessary to transmit multiple sets of digital signals by multiple clocks to include the full commands and address information. Among them, some address/command input signal entered at a specific clock, there will be an input signal from a pin that is useless for address and command information. For example, the input on pin CA3 of LPDDR4 will not be used as a command or address input at a certain clock time. Therefore, according to the embodiment of the present invention, a decoding selection command can be sent to the specific clock time, and the decoding selection command received by pin CA3 at the specific clock time is only used as a selection command for the subsequent decoding mode, and will not impact the final address decoding result.

In the specific embodiment of the present invention, when one of the pins of the input terminal is not used as a valid address/command input pin at a certain clock time, that pin is used to input the decode selection command at the clock time, thereby there is no need to add additional pins for the decoding selection instruction, and also there is no need to change the timing and path of the address/command input signal, thus realizing decoding mode selection with flexibility and efficiency.

According to the embodiment, the address/command input signal CA<5:0> passes through the buffering unit 3031 and the logic process by logic control unit 3032, and is then sent to the normal address latch unit 3033 to store the required column address signal ColAdr0<9:4>, and later the column address signal ColAdr0<9:4> is sent to the memory block local control unit 301, which corresponds to the memory block address in the address/command input signal to perform column address decoding.

In another embodiment according to the present invention, structures of the input module 303 may include technical variations known to those of ordinary skills in the art and will not be described in detail here.

In the above embodiment, the memory block local control unit 301 includes a column decoding unit, and the memory block 302 is coupled to the output terminal of the column secondary decoding unit 3013. This is based on the decoding output from the column secondary decoding unit 3013 to access the address, and to select the memory unit having the corresponding access address.

The column decoding unit further includes a column normal pre-decoding unit 3011, a column redundant pre-decoding unit 3012, and a column secondary decoding unit 3013; and the output terminals of the column redundant pre-decoding unit 3012 and the column normal pre-decoding unit 3011. Both are coupled to the input end of the column secondary decoding unit 3012. After column redundancy decoding or column normal pre-decoding, the address/command input signal enters the column secondary decoding unit 3013 for secondary decoding to obtain the final column address information. For example, the column address of the normal memory unit is obtained after decoding by the column normal pre-decoding unit 3011 and the column secondary decoding unit 3013, so that a column of memory units in the memory block 302 corresponding to the column address can be selected. For another example, after decoding by the column redundancy pre-decoding unit 3012 and the column secondary decoding unit 3013, the column address of the redundant memory cell is obtained, so that a column of redundant memory cells in the memory block 302 that have a corresponding column address can be selected.

According to the embodiment, the memory block local control unit 301 further includes a first local latch unit 3015, the input end of the first local latch unit 3015 is coupled to the output end of the normal address latch unit 3033, the output terminal of the first local latch unit 3015 is coupled to the input terminals of the column redundant pre-decoding unit 3012 and the column normal pre-decoding unit 3011.

After the column address signal ColAdr0<9:4> output from the normal address latch unit 3033 passes through the first local latch unit 3015, it is output to the column redundancy pre-decoding unit 3012 and the column normal pre-decoding unit 3011.

The memory device further includes a selection module 304, and the output end of the selection module 304 is coupled to both the enable end of the column redundancy pre-decoding unit 3012 and the enable end of the column normal pre-decoding unit 3011. The input terminal of the selection module 304 is coupled to the input module 303 and is configured to receive the decoding selection instruction in the address/command input signal at the corresponding clock time, and to control the station according to the decoding selection instruction in the address/command input signal. The column redundancy pre-decoding unit 3012 enables or controls the column normal pre-decoding unit 3011. For example, if the decode selection instruction is 1 (high level), the selection module 304 outputs the first enable signal RedColEn=1, which controls the column redundancy pre-decoding unit 3012 to be enabling, performs column redundancy decoding to the address/command input signal ColAdr0<9:4>, in order to obtain the column address of the redundant memory cell. If the decoding selection instruction is 0 (low level), the selection module 304 outputs the first enable signal. RedColEn=0, controls the column normal pre-decoding unit 3011 to be enabling, and performs column normal decoding on the address/command input signal ColAdr0<9:4>, in order to obtain the column address of the normal memory cell.

According to the embodiment, the selection module 304 includes: a multiplexer MUX, the first input of the multiplexer MUX is coupled to the input module 303; its second input is connected to a reference level, in this embodiment, the reference level is low level 0. The control terminal of the selection module 304 is connected to a test control signal Cm0_ts_RedTest, and the test control signal, Cm0_ts_RedTest, is used to control the multiplexer MUX to output a signal corresponding to the first input terminal or the second input terminal. The selection module 304 further includes a test enable latch unit 3041, and the input terminal of the test enable latch unit 3041 is coupled to the output terminal of the multiplexer MUX.

When the test control signal, Cm0_ts_RedTest=1 is used, the multiplexer MUX outputs the decode selection instruction input by the first input terminal to the test enable hitch unit 3041 and the test enable latch unit 3041. After 3041, the first enable signal RedColEn0 is output to the memory block local control unit 301 for enabling the column normal pre-decoding unit 3011 or the column redundant pre-decoding unit 3012.

The memory block local control unit 301 also includes a second local latch unit 3016. The input terminal of the second local latch unit 3016 is coupled to the output terminal of the selection module 304 for latching the first enable Signal RedColEn0; the output end of the second local latch unit 3016 is coupled to the enable end of the column redundancy pre-decoding unit 3012 and the column normal pre-decoding unit 3011.

After the address/command input signal is entered in the input module 303, the input signal passes through the buffer unit 3031 and the logic control unit 3032, the normal address memory 3033 latches the required address information ColAdr<9:4>; at the same time, the selection module 304 outputs the first enable signal RedColEn0 based on the obtained decoding selection instruction in the address/command input signal. The column address signal, ColAdr<9:4>, and the first enable signal, RedColEn0, reach the memory block local control unit 301, respectively, then are latched by the first local latch r unit 3015 and the second local latch unit 3016, respectively. When the second local latch unit 3016 outputs the first enable signal RedColEn=1, the decoding of the normal path will be stopped, and the column redundancy pre-decoding unit 3012 will be enabled; when the first enable signal RedColEn=0, the column redundancy pre-decoding unit 3012 will be stopped, and the normal decoding path will not be affected. In a specific implementation, when the decode selection instruction is 1, the first enable signal RedColEn=1; and when the decode selection instruction is 0, the first enable signal RedColEn=0.

When performing column tests on redundant memory units and normal memory units, the memory block local control unit 301 can be controlled to perform corresponding redundant decoding or normal decoding by setting the decoding selection instruction, thereby making the testing process more flexible. There is no need to switch the signal input interface.

When switching between the normal memory unit and the redundant memory unit test, only the decoding selection instruction needs to be controlled. Each latch unit is controlled by the same clock signal, CLK, so the column address signal ColAdr0<9:4>, the control time sequence and the path of the first enable signal RedColEn are completely consistent, which can reduce human test errors, thereby improving the accuracy and convenience of the test.

According to the embodiment, the local memory block control unit 3014 further includes a column address comparison unit 3014, the input terminal of the column address comparison unit 3014 is coupled to the input module 303, and the output terminal of the column address comparison unit 3014 is coupled to the enable end of the column normal pre-decoding unit 3011 and the column redundant pre-decoding unit 3011.

The address comparison unit 3014 is used to store the defect address information acquired during the test. When performing normal read and write operations on the memory device, the address comparison unit 3014 compares the column address signal ColAdr<9:4> with the defect address intimation; based on the comparison result, it outputs a second enable signal RedColRepair in order to control the decoding unit to perform corresponding redundant decoding or normal decoding on the address/command input signal. Specifically, when the access address matches the defect address, the second enable signal RedColRepair=1, the access address is invalid, so the column redundancy pre-decoding unit 3012 is enabled, and the input signal is listed. Redundant pre-decoding obtains the column address of the redundant memory cell that replaces the defective address. When the access address does not match the defective address, the access address is valid. When the second enable signal RedColRepair=0, it enables (Enable) the column normal pre-decoding unit 3011, which performs column normal pre-decoding 3011 on the input signal to obtain the column address of the normal memory unit.

When performing normal read and write operations on the memory device, the test control signal, Cm0_ts_RedTest=0, can be set so that the selection module 304 does not obtain the decoding selection instruction, therefore stopping the selection function of the selection module 304 for the redundant decoding path.

Figure 4:
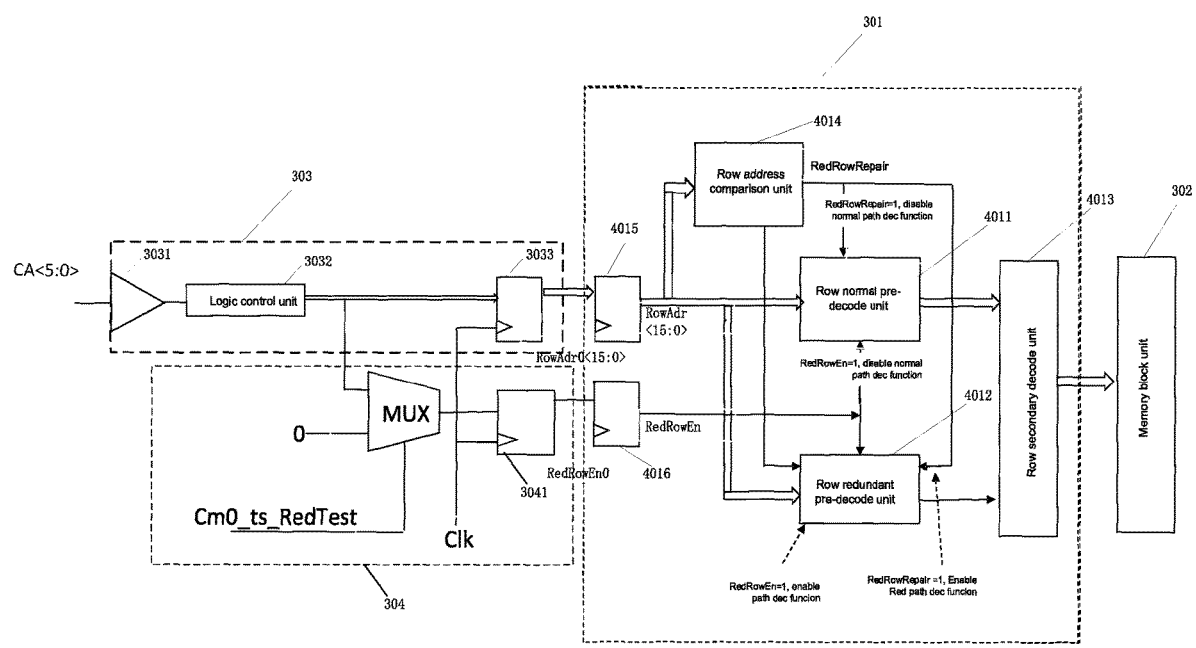
FIG. 4 is a schematic structural diagram of a memory device according to some embodiments of the present disclosure.

Please refer to FIG. 4, which is a schematic structural diagram of a memory device according to another embodiment of the present disclosure.

FIG. 4 shows a schematic diagram of the exemplary circuit structure only related to the column decoding.

The input module 303 includes: an input interface, a buffer unit 3031 coupled to the input terminal, a logic control unit 3032 coupled to the output of the buffer unit 3031, and further coupled to the normal address latch unit 4033 at the output of the logic control unit 3032. After the address/command input signal CA<5:0> is buffered by the buffer unit 3031 and processed by the logic control unit 3032, it is sent to the normal address latch unit 3033 to latch the row address signal RowAdr0<15:0>, and then sends the row address signal RowAdr0<15:0> into the row decoding unit in the local control unit 301 of the memory block corresponding to the block address in the address/command input signal to decode the row address.

The row decoding unit in the memory block local control unit 301 includes: a row normal pre-decoding unit 4011, a row redundant pre-decoding unit 4012, and a row secondary decoding unit 4013. The row redundant pre-decoding unit 4012 and the output ends of the row normal pre-decoding unit 4011 are all coupled to the input ends of the row secondary decoding unit 4012, and the address/command input signal enters the row secondary decoding unit 4012 after row redundancy decoding or row normal pre-decoding twice to obtain the final row address information.

According to the embodiment, the memory block local control unit 301 further includes a first local latch unit 4015, which is configured to locally latch the row address signal RowAdr0<15:0>. The input terminal of the first local latch unit 4015 is coupled to the output terminal of the normal address latch unit 3033, and the output terminal of the first local latch unit 4015 is coupled to the row redundancy pre-decoding unit 4012, which is the input terminal of the line normal pre-decoding unit 4011.

The memory block local control unit 301 also includes a second local latch unit 4016. The input terminal of the second local latch unit 4016 is coupled to the output terminal of the selection module 304 and is used to latch the first enable signal RedRowEn0. The output end of the second local latch unit 4016 is coupled to the enabling end of the row redundant pre-decoding unit 4012 and the row normal pre-decoding unit 4011.

When the test control signal Cm0_ts_RedTest=1, the multiplexer MUX outputs the decoding selection instruction input from the first input terminal to the test enable latch unit 3041; after passing the test enable latch unit 3041, the first enable signal RedRowEn0 is output to the memory block local control unit 301 for enabling the row normal pre-decoding unit 4011 or the row redundant pre-decoding unit 4012. When the locally latched first enable signal RedRowEn=1, the decoding of the normal path will be stopped, and the row redundant pre-decoding unit 4012 will be enabled; when the first enable signal RedRowEn=0, then the row redundancy pre-decoding unit 4012 will be stopped, and the normal decoding path will not be affected.

Corresponding to the column test, when performing the row test, one can control whether to perform redundant decoding or normal decoding on the row address signal through the address/command input signal of the decoding selection instruction.

In this specific embodiment, the local memory block control unit 301 further includes a row address comparison unit 4014; the input end of the row address comparison unit 4014 is coupled to the input module 303, and the output end of the row address comparison unit 4014. It is coupled to the enable terminal of the row normal pre-decoding unit 4011 and the row redundant pre-decoding unit 4011.

The row address comparison unit 4014 is used to store the defect address information acquired during the test. When performing normal read and write operations on the memory device, the row address comparison unit 4014 compares the row address signal RowAdr<15:0> with the defect address information, and outputs a second enable signal according to the comparison result RedRowRepair to control the decoding unit to perform corresponding redundant decoding or normal decoding on the address/command input signal. Specifically, when the access address matches the defect address, the second enable signal RedRowRepair=1, the access address is invalid, so the row redundancy pre-decoding unit 4012 is enabled, and the input signal is executed. Redundant pre-decoding to obtain the row address of the redundant memory cell that replaces the defective address; when the access address does not match the defective address, the access address is valid. When the second enable signal RedRowRepair=0, the enable row normal pre-decoding unit 4011 performs row normal pre-decoding 4011 on the input signal to obtain the row address of the normal memory unit.

When performing normal read and write operations on the memory, the test control signal Cm0_ts_RedTest=0 can be set so that the selection module 304 does not obtain the decoding selection instruction, and the selection function of the selection module 304 for the redundant decoding path is stopped. At this time, it is possible to not set the decoding selection instruction.

The embodiment of the present invention also provides a memory addressing method.

Figure 5:
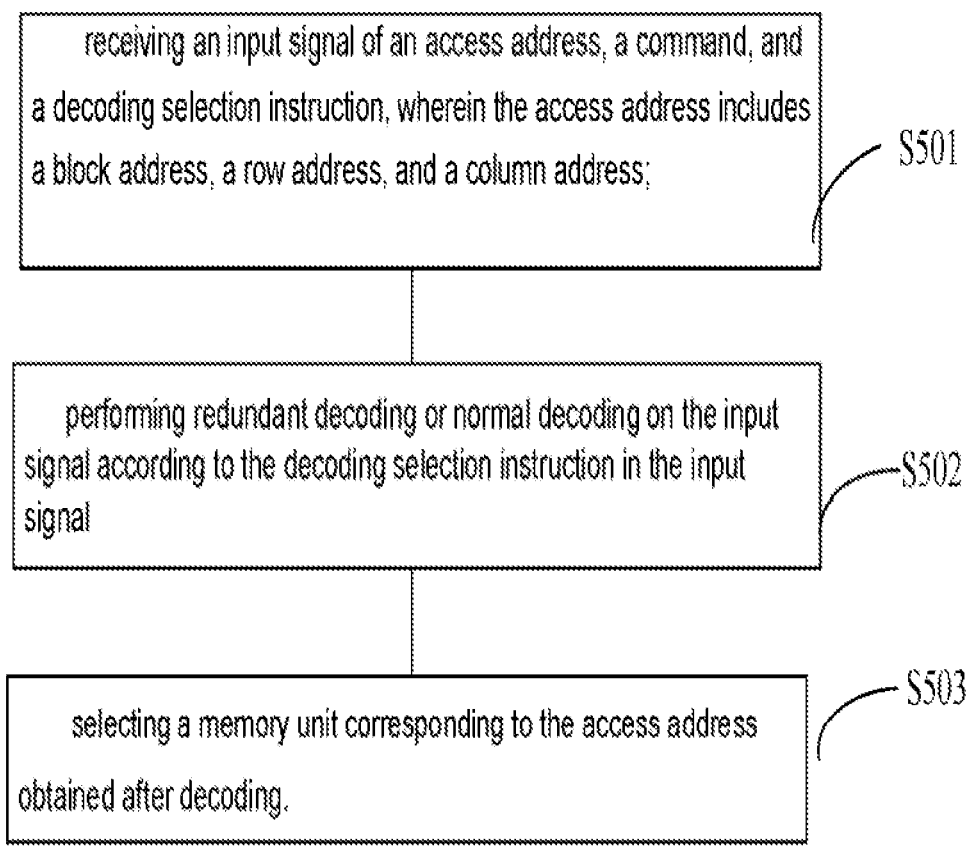
FIG. 5 is a memory addressing method according to some embodiments of the present disclosure.

FIG. 5 describes the addressing method of a memory device as the following:

Step S501: Receive an address/command input signal, including at least an access address, a command, and a decoding selection instruction, where the access address includes a block address, a row address, and a column address.

The address/command input signal may be received through a plurality of input pins. The address/command input signal includes a plurality of sets of digital signals, wherein each set of the digital signals includes a plurality of electrical level inputs via the plurality of input pins. The decoding selection instruction is a level signal input from an input pin in a set of digital signals, and the decoding selection instruction corresponds to a decoding mode of the address/command input signal.

Step S502: Perform redundant decoding or normal decoding on the address/command input signal corresponding to the decoding selection instruction according to the decoding selection instruction in the address/command input signal.

Here, the redundant decoding includes redundant pre-decoding and secondary decoding and the normal decoding includes normal pre-decoding and secondary decoding.

The corresponding decoding method for the address/command input signal can be selected by setting the decoding selection instruction. For example, when the decoding selection instruction is 1, normal decoding is performed; when the decoding selection instruction is 0, redundant decoding is performed.

Step S503: Selecting a memory unit corresponding to the access address based on the address obtained after decoding.

The above steps can be applied to decode the row address and column address, respectively.

By setting the corresponding decoding selection instruction, one can switch the access to the redundant memory unit and the normal memory unit, making it more flexible in the testing process, meanwhile the control time sequence is consistent, avoiding human test errors and improving the test accuracy and flexibility.

The addressing method of the tummy device of the present invention further includes: during normal use, comparing the access address in the address/command input signal with the defect address information, and performing relevant redundant decoding or normal decoding based on the comparison result. Specifically, when the access address matches the defective address, the access address is invalid, and the input signal goes through redundancy pre-decoding to obtain the address of the redundant memory unit that replaces the defect address. When the access address does not match the defective address, the access address is valid, and the input signal is normally decoded to obtain the address of the normal memory unit.

The above are only the preferred embodiments of the present invention. It should be pointed out that for those of ordinary skill in the art, without departing from the principle of the present invention, several improvements and modifications can be made, and these improvements and modifications should also be considered in the protection scope of the invention.

The invention claimed is:

1. A memory device, comprising:
   an input module for receiving an input signal, wherein the input signal includes an access address, a command, and a decoding selection instruction, wherein the access address includes a block address, a row address, and a column address;

a memory array comprising a plurality of memory blocks, wherein each of the plurality of memory blocks includes a plurality of memory units arranged in an array;

a control module connecting to an output of the input module, wherein the control module comprises a plurality of memory block local control units, wherein each of the plurality of memory block local control unit is connected to one of the plurality of memory blocks in one-to-one correspondence, wherein the plurality of memory block local control units each includes one decoding unit, wherein the one decoding unit is configured to perform redundant decoding or normal decoding on the row address or the column address of the input signal, wherein an input of the one decoding unit is coupled to the input module, an output of the one decoding unit is coupled to one of the plurality of memory blocks; and wherein the control module decodes the input signal having a corresponding row or column address and selects a memory unit of the plurality of memory units of a corresponding access address; and a selection module, wherein an input of the selection module is coupled to the input module, and an output of the selection module is coupled to the decoding unit, wherein the selection module is configured to send the decoding selection instruction in the input signal to the decoding unit to generate a first enable signal to perform redundant decoding or normal decoding;

wherein the input module comprises: an input terminal, a buffer unit coupled to the input terminal, a logic control unit coupled to an output of the buffer unit, and a normal address latch unit coupled to an output of the logic control unit; and wherein each of the plurality of memory block local control units further comprises a first local latch unit, wherein an input of the first local latch unit is coupled to an output of the normal address latch unit of the input module.

2. The memory device according to claim 1, wherein the decoding unit comprises a redundant pre-decoding unit, a normal pre-decoding unit, and a secondary decoding unit; wherein the output of the selection module is coupled to an enable input of the redundant pre-decoding unit and an enable input of the normal pre-decoding unit; and wherein an output of the redundant pre-decoding unit and an output of the normal pre-decoding unit are both coupled to an input of the secondary decoding unit.

3. The memory device according to claim 1, wherein each of the plurality of the memory block local control units further comprises an address comparison unit, wherein an input of the address comparison unit is coupled to the input module, and an output of the address comparison unit is coupled to the decoding unit, wherein the address comparison unit stores defective address information, compares the access address in the input signal with the defective address information, and outputs a second enable signal based on comparison, and wherein the second enable signal controls the decoding unit to perform redundant decoding or normal decoding on the row address and the column address of the input signal.

4. The memory device of claim 1, wherein the input module comprises a plurality of input pins, wherein the input signal comprises multiple sets of digital signals, wherein each set of the multiple sets of digital signals comprises a plurality of level signals from the plurality of input pins, wherein the decoding selection instruction includes one of the plurality of level signals from one of the plurality of input pins of one of the multiple sets of digital signals, and agrees with how the row address or the column address of the input signal is decoded in the redundant decoding or the normal decoding.

5. The memory device according to claim 1, wherein the selection module comprises: a multiplexer comprising a first input of the multiplexer coupled to the input module, a second input coupled to a reference level, and a control terminal coupled to a test control signal, wherein the test control signal controls the multiplexer to output a signal corresponding to the first input or the second input of the multiplexer.

6. The memory device according to claim 5, wherein the selection module further comprises: a test enable latch unit, an input of the test enable latch unit is coupled to an output of the multiplexer.

7. The memory device according to claim 6, wherein the decoding unit further comprises: a second local latch unit, wherein an input of the second local latch unit is coupled to an output of the test enable latch unit of the selection module.

8. The memory device according to claim 1, wherein each of the plurality of memory block local control units further comprises another decoding unit, wherein the two decoding units decode the row address and the column address respectively in the access address.

9. A memory device addressing method, comprising:
receiving an input signal from an input module comprising: an access address, a command, and a decoding selection instruction, where the access address includes a block address, a row address, and a column address;
performing redundant decoding or normal decoding on the row address or the column address of the input signal according to the decoding selection instruction in the input signal; and
selecting a memory unit corresponding to the access address obtained after decoding;
wherein a control module connects to an output of the input module, wherein the control module comprises a plurality of memory block local control units;
wherein the input module comprises: an input terminal, a buffer unit coupled to the input terminal, a logic control unit coupled to an output of the buffer unit, and a normal address latch unit coupled to an output of the logic control unit; and
wherein a plurality of memory block local control units each comprises a first local latch unit, wherein an input of the first local latch unit is coupled to an output of the normal address latch unit of the input module.

10. The memory device addressing method according to claim 9, wherein the redundant decoding comprise redundant pre-decoding and redundant secondary decoding; and wherein the normal decoding includes normal pre-decoding and normal secondary decoding.

11. The memory device addressing method according to claim 9, further comprising: comparing the access address in the input signal with a defect address information in normal use of the memory device, and performing redundant decoding or normal decoding on the input signal according to a comparison result.

12. The memory device addressing method of claim 9, wherein the input signal is received through a plurality of input pins, wherein the input signal comprises multiple sets of digital signals, wherein each of the multiple sets of digital signals includes a plurality of level signals inputted through the plurality of input pins, and wherein the decoding selection instruction is one of the plurality of level signals inputted from one of the plurality of input pins of said set of digital signals, and wherein the decoding selection instruction agrees with how the row address or the column address of the input signal is decoded in the redundant decoding or in normal decoding.

13. The memory device addressing method according to claim 9, further comprising performing decoding the row address and the column address in the input signal separately.

* * * * *